(12) United States Patent
Nikitin

(10) Patent No.: US 8,293,586 B2
(45) Date of Patent: Oct. 23, 2012

(54) METHOD OF MANUFACTURING AN ELECTRONIC SYSTEM

(75) Inventor: Ivan Nikitin, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 801 days.

(21) Appl. No.: 12/237,876

(22) Filed: Sep. 25, 2008

(65) Prior Publication Data

US 2010/0072616 A1    Mar. 25, 2010

(51) Int. Cl.
*H01L 21/50* (2006.01)
*H01L 23/488* (2006.01)

(52) U.S. Cl. ........ 438/119; 438/118; 257/734; 257/737; 257/773; 257/774; 257/778

(58) Field of Classification Search ................ 257/737, 257/778, 779; 438/119
See application file for complete search history.

(56) References Cited

U.S. PATENT DOCUMENTS

| | | | |
|---|---|---|---|
| 4,931,323 A | 6/1990 | Manitt et al. | |
| 5,918,113 A | 6/1999 | Higashi et al. | |
| 6,639,324 B1 * | 10/2003 | Chien | 257/778 |
| 6,835,580 B1 * | 12/2004 | Knapp et al. | 438/15 |
| 7,148,569 B1 * | 12/2006 | Wang | 257/738 |
| 7,429,798 B2 * | 9/2008 | Kim | 257/778 |
| 7,514,295 B2 * | 4/2009 | Mizukoshi et al. | 438/118 |
| 2003/0222343 A1 * | 12/2003 | Sakaida | 257/737 |
| 2007/0076390 A1 | 4/2007 | Kroener et al. | |
| 2007/0104869 A1 | 5/2007 | Kodas et al. | |
| 2007/0131353 A1 | 6/2007 | Gobl | |
| 2007/0154634 A1 | 7/2007 | Renn | |
| 2007/0208082 A1 | 9/2007 | Woster et al. | |
| 2007/0226995 A1 | 10/2007 | Bone | |
| 2009/0184419 A1 * | 7/2009 | Pendse | 257/737 |
| 2010/0072628 A1 * | 3/2010 | Nikitin et al. | 257/774 |

FOREIGN PATENT DOCUMENTS

JP  200635208  12/2006

* cited by examiner

*Primary Examiner* — Matthew W Such
*Assistant Examiner* — David Spalla
(74) *Attorney, Agent, or Firm* — Dicke, Billig & Czaja, PLLC

(57) ABSTRACT

A method of manufacturing an electronic system. One embodiment provides a semiconductor chip having a first main face and a second main face opposite to the first main face. A mask is applied to the first main face of the semiconductor chip. A compound is applied to the first main face of the semiconductor chip. The compound includes electronically conductive particles. The semiconductor chip is coupled to a carrier with the compound facing the carrier.

10 Claims, 8 Drawing Sheets

METHOD OF MANUFACTURING AN ELECTRONIC SYSTEM

BACKGROUND

The present invention relates to a method of manufacturing an electronic system, and a semiconductor device.

Semiconductor chips or semiconductor dies can be coupled to carriers like, for example, printed circuit boards. In particular, semiconductor chips can include electrical contact elements on at least one of their main surfaces and the semiconductor chips have to be coupled to the carrier with the contact element forming an electrically and thermally conducting connection there between. Moreover, the connection between the semiconductor chip and the carrier should have satisfactory mechanical properties like mechanical strength and stability against thermal mechanical stress. Furthermore, the number of fabrication processes should be kept low.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
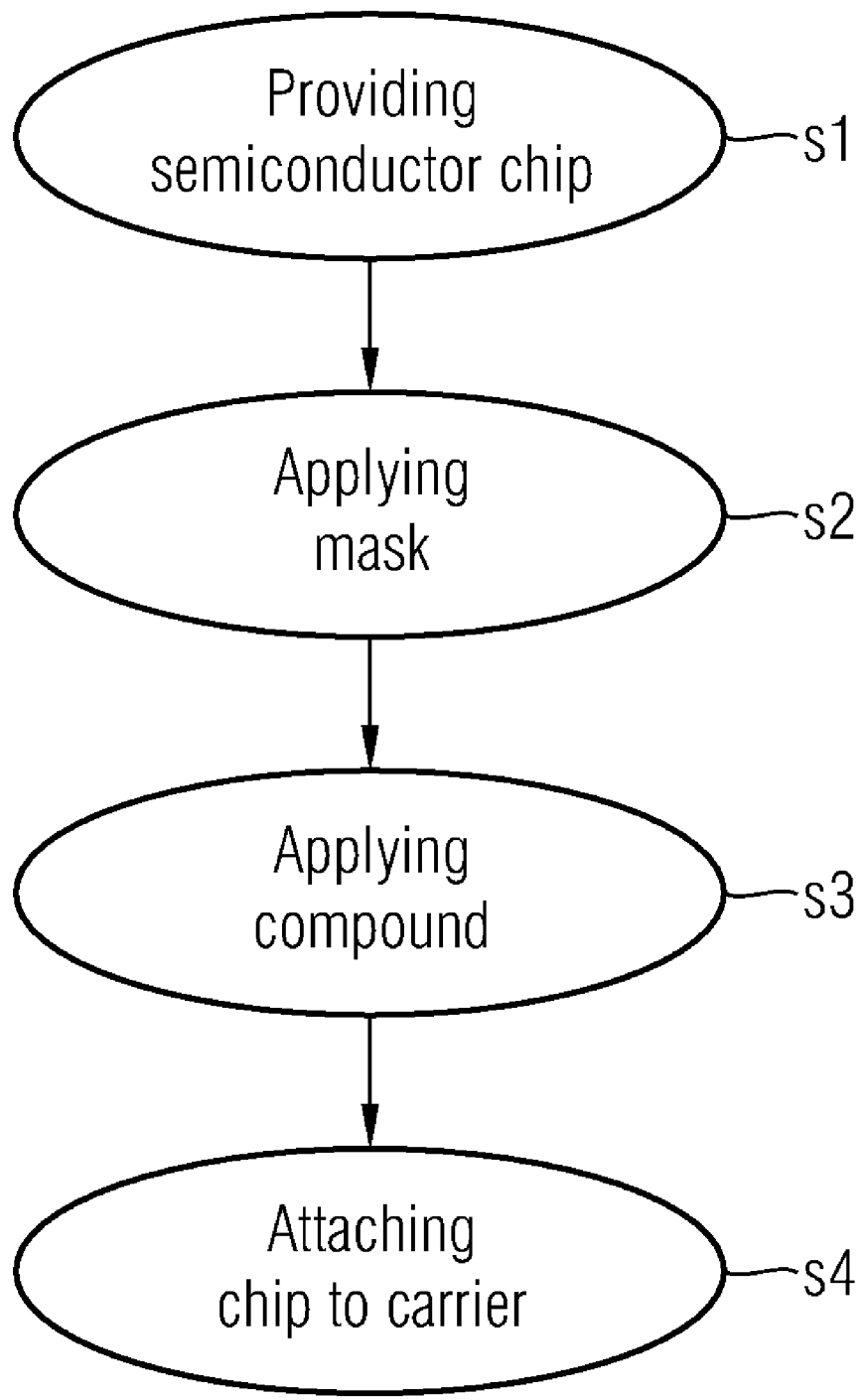
FIG. 1 illustrates a flow diagram of one embodiment of a method of manufacturing an electronic system.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "coupled", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Embodiments of a method of manufacturing an electronic system and the embodiments of a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. The semiconductor chips can also include a vertical transistor structure wherein one or more contact elements are arranged on a first main face of the semiconductor chip and one or more other contact elements may be arranged on a second main face of the semiconductor chip opposite to the first main face of the semiconductor chip. In general the term "semiconductor chip" as used in this application can have different meanings one of which is a semiconductor die or semiconductor substrate including an electrical circuit.

In several embodiments, layers or layer stacks are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, or an electrically conducting organic material, or an electrically conducting semiconductor material.

FIG. 1 illustrates a flow diagram of a method of manufacturing an electronic system according to one embodiment. The method includes providing a semiconductor chip having a first main face and a second main face opposite to the first main face (s1), applying a mask to the first main face of the semiconductor chip (s2), applying a compound to the first main face of the semiconductor chip, the compound including electronically conductive particles (s3), and attaching the semiconductor chip to a carrier with the compound facing the carrier (s4).

According to one embodiment, the carrier includes conductive elements to be covered by the compound.

According to one embodiment, the compound is applied selectively to the first main face of the chip. In one embodiment, the mask applied to the first main face of the semiconductor chip can include openings and the compound can be applied into the openings of the mask.

According to one embodiment, the carrier is at least one of a printed circuit board, a ceramic substrate, and a laminated substrate.

According to one embodiment, the mask is made of at least one of a polymer, a foil material, and a photo-structurable material. In one embodiment, if the mask material is made of a photo-structurable material, the mask can be fabricated by applying a layer of the photo-structurable material and forming openings into the layer at predetermined positions by using, for example, a laser beam directed onto the surface of the layer.

According to one embodiment, the method further includes attaching a metal carrier to the second main face of the semiconductor chip. According to a further embodiment, the second main face of the semiconductor chip is soldered to the metal carrier. According to a further embodiment, the compound is applied to the metal carrier when applying the compound to the first main face of the semiconductor chip. According to a further embodiment, the metal carrier and the carrier are electrically coupled when attaching the semiconductor chip to the carrier with the compound facing the carrier.

According to one embodiment, the electronically conductive particles have a diameter smaller than 1000 nm, covering also all incremental values decreasing from 1000 nm, wherein the increment is 1 nm. According to further embodiment, the electronically conductive particles have a diameter smaller than 400 nm. According to a further embodiment, the electronically conductive particles have a diameter smaller than 100 nm.

According to one embodiment, the electronically conductive particles include an element metal like Ag, Sn or Cu, or an alloy.

According to one embodiment, the semiconductor chip is coupled to the carrier at a temperature below the melting temperature of the material of the electronically conductive particles.

Figure 2A:
FIGS. 2A-D illustrate schematic cross-sectional representations of intermediate products and of an electronic system for illustrating one embodiment of a method of manufacturing an electronic system.
Figure 2B:
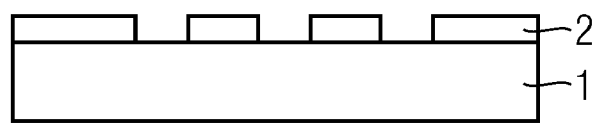
Figure 2C:
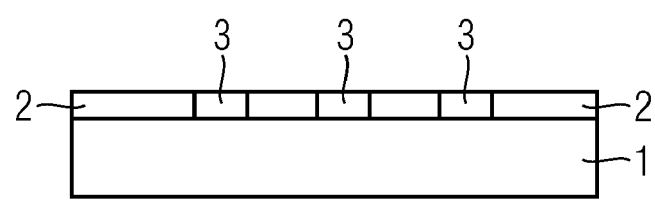
Figure 2D:
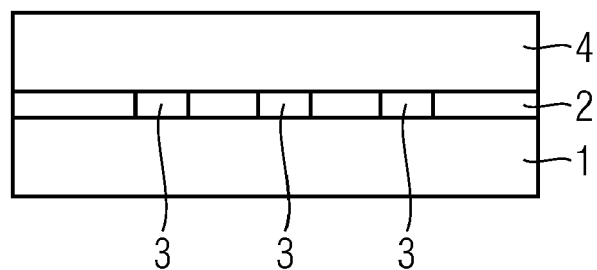

Referring to FIGS. 2A-D, there are illustrated cross-sectional representations of intermediate products and an electronic system for illustrating one embodiment of a method of manufacturing an electronic system. FIG. 2A illustrates a cross-sectional representation of a semiconductor chip 1. The semiconductor chip 1 may include contact elements (not illustrated) on at least one of its surfaces. FIG. 2B illustrates a cross-section of an intermediate product after a mask 2 has been applied to a first main face of the semiconductor chip 1. FIG. 2C illustrates a cross-section of an intermediate product obtained after a compound 3 has been applied to the first main face of the semiconductor chip 1, the compound 3 including electronically conductive particles. The compound 3 is applied to the first main face of the semiconductor chip 1 by filling it into holes of the mask 2. FIG. 2D illustrates a cross-section of an intermediate product obtained after attaching the semiconductor chip 1 to a carrier 4 with the compound 3 facing the carrier 4.

Figure 3:
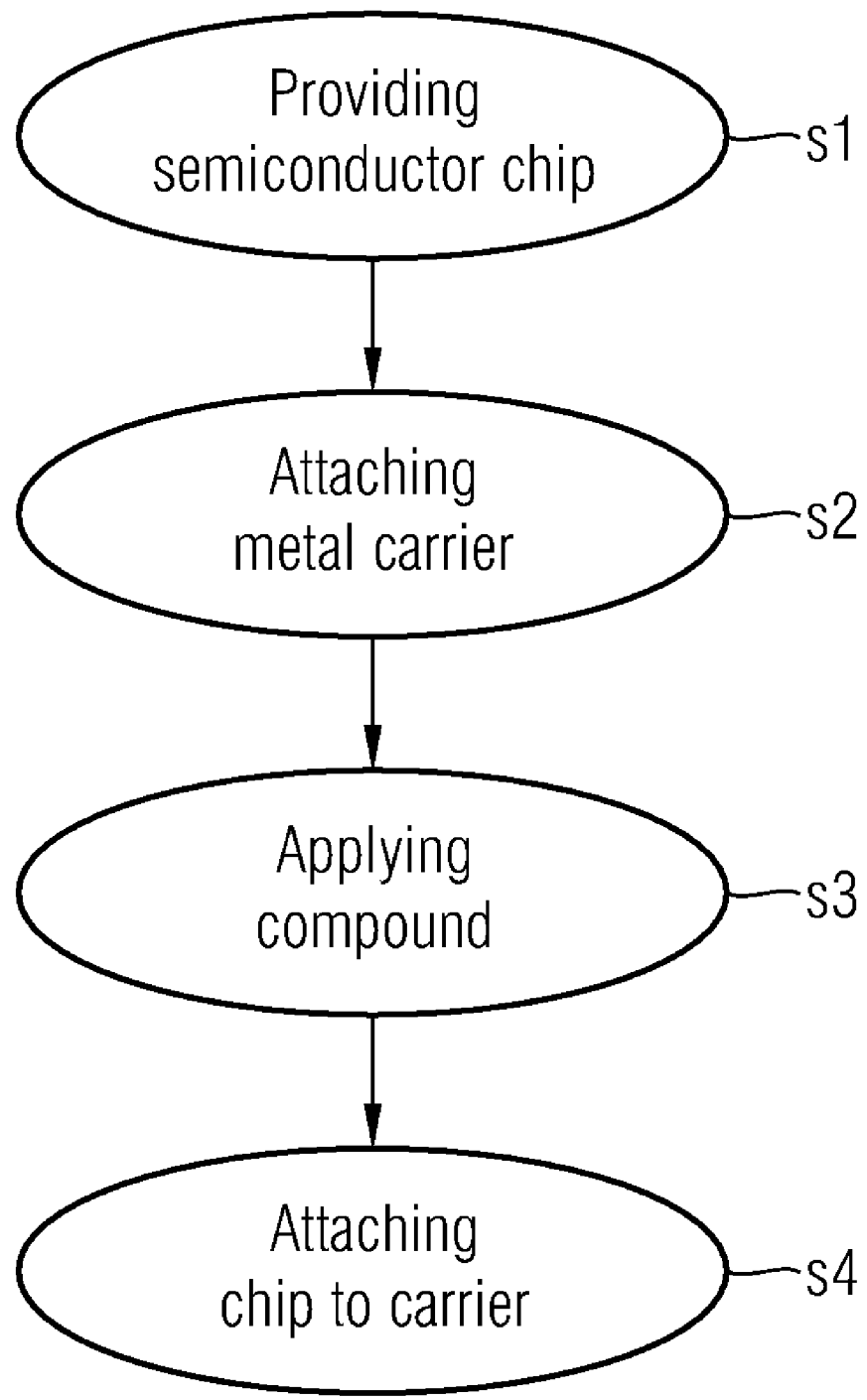
FIG. 3 illustrates a flow diagram of one embodiment of a method of manufacturing an electronic system.

Referring to FIG. 3, there is illustrated a flow diagram of a method of manufacturing an electronic system according to one embodiment. The method includes providing a semiconductor chip having a first main face and a second main face opposite to the first main face (s1), attaching a metal carrier to the second main face of the semiconductor chip (s2), applying a compound to the first main face of the semiconductor chip, the compound including electronically conductive particles (s3), and attaching the semiconductor chip to a carrier with the compound facing the carrier (s4).

According to one embodiment, the method further includes applying a mask to the first main face of the semiconductor chip. In one embodiment, the mask can be made of at least one of a polymer, a foil material, and a photo-structurable material.

According to one embodiment, the carrier includes conductive elements to be covered by the compound.

According to one embodiment, the compound is applied selectively to the first main face of the chip. In one embodiment, a mask can be applied to the first main face, the mask including openings into which the compound can be filled.

According to one embodiment, the carrier is at least one of a printed circuit board, a ceramic substrate and a laminated substrate.

According to one embodiment, the second main face of the chip is soldered to the metal carrier.

According to one embodiment, the carrier includes conductive elements to be covered by the compound.

According to one embodiment, the compound is applied to the metal carrier when applying the compound to the first main face of the semiconductor chip.

According to one embodiment, the metal carrier and the carrier are electrically coupled when attaching the semiconductor chip to the carrier with the compound facing the carrier.

According to one embodiment, the electronically conductive particles have a diameter smaller 1000 nm, covering also all values incrementally decreasing from 1000 nm, the increment being 1 nm. According to a further embodiment, the electronically conductive particles have a diameter smaller then 400 nm. According to a further embodiment, the electronically conductive particles have a diameter smaller than 100 nm.

According to one embodiment, the electronically conductive particles include an element metal like Ag, Sn, and Cu, or an alloy.

According to one embodiment, the semiconductor chip is coupled to the carrier at a temperature below the melting temperature of the material of the electronically conductive particles.

Figure 4A:
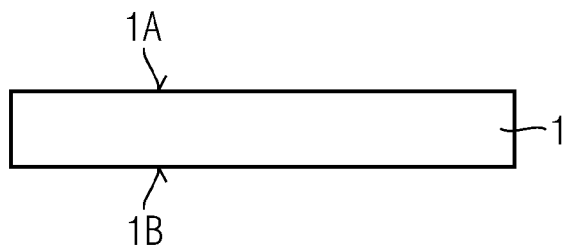
FIGS. 4A-D illustrate schematic cross-sectional representations of intermediate products and of an electronic system for illustrating one embodiment of a method of manufacturing an electronic system.
Figure 4B:
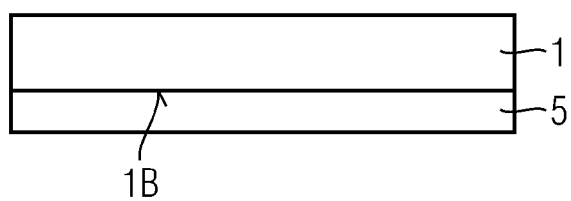
Figure 4C:
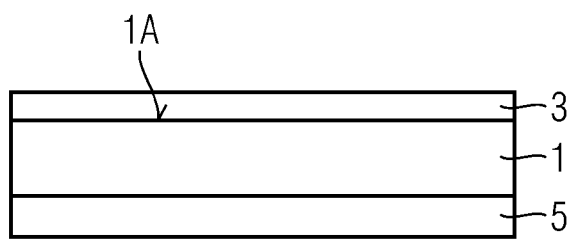
Figure 4D:
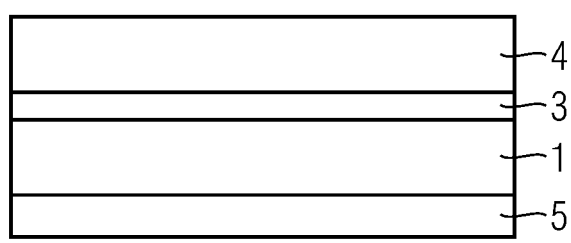

Referring to FIGS. 4A-D, there are illustrated cross-sectional representations of intermediate products and an electronic system for illustrating one embodiment of a method of manufacturing an electronic system. FIG. 4A illustrates a cross-section of a semiconductor chip 1 having a first main face 1A and a second main face 1B opposite to the first main face. The semiconductor chip 1 may include contact elements (not illustrated) on at least one of the first main face 1A and the second main face 1B. FIG. 4B illustrates a cross-section of an intermediate product obtained after attaching a metal carrier 5 to the second main face 1B of the semiconductor chip 1. FIG. 4C illustrates a cross-section of an intermediate product obtained after applying a compound 3 to the first main face 1A of the semiconductor chip 1, the compound 3 including electronically conductive particles. FIG. 4D illustrates a cross-section of an intermediate product obtained after attaching the semiconductor chip 1 to a carrier 4 with the compound 3 facing the carrier 4.

Figure 5A:
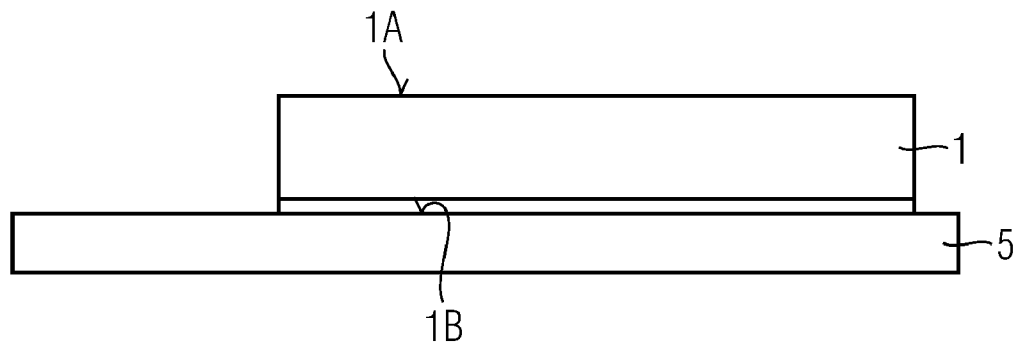
FIGS. 5A-G illustrate schematic cross-sectional representations of intermediate products and of an electronic system for illustrating one embodiment of a method of manufacturing an electronic system.

Referring to FIGS. 5A-G, there are illustrated cross-sectional representations of intermediate products and an electronic system for illustrating an embodiment of a method of manufacturing an electronic system. FIG. 5A illustrates an intermediate product obtained after attaching a semiconductor chip 1 onto a metal carrier 5. The semiconductor chip 1 includes in the present embodiment a power transistor having contact pads (not illustrated) on either one of its main surfaces. For example, power transistor chip 1 may include an internal MOSFET transistor structure having source, drain and gate terminals and the source and gate terminals may be coupled with contact elements located on a first main face 1A of the chip 1 and the drain terminal may be coupled to a contact element on a second main face 1B of the chip 1. The second main face of the chip 1 is coupled to the metal carrier 5. The metal carrier 5 can be, for example, a copper plate. The semiconductor chip 1 can be coupled to the copper plate 5, for example, by a bonding process which can be diffusion bonding or adhesion bonding.

Figure 5B:
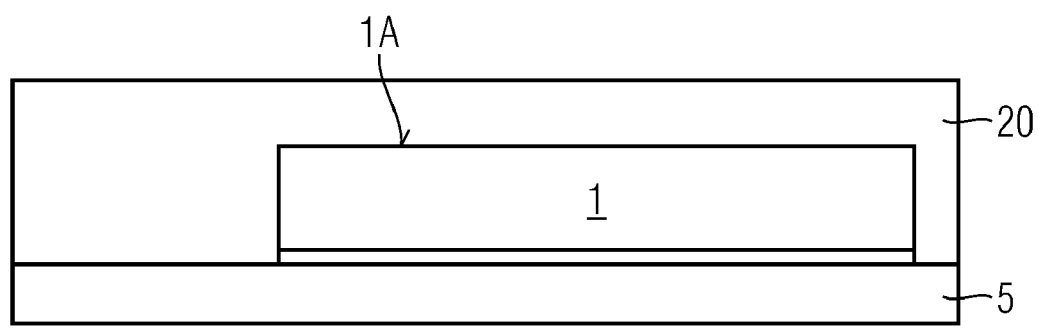

FIG. 5B illustrates a cross-sectional representation of an intermediate product obtained after applying a mask layer 20 to the first main face 1A and side faces of the chip 1. The mask layer 20 can be made of a polymer foil which can be deposited by a lamination process onto the first main face 1A and side faces of the chip 1. The material of the polymer foil can be such that it can be structured by photo ablation, in one embodiment by applying a laser beam onto the surface of the mask layer 20. This allows to fabricate openings into the mask layer 20. The material of the mask layer 20 can be made of any other photo-structurable material. The material can also be any other insulating material which does not have photo-structurable properties so that in this case openings into the mask layer 20 will have to be formed by other processes like, for example, etching.

Figure 5C:
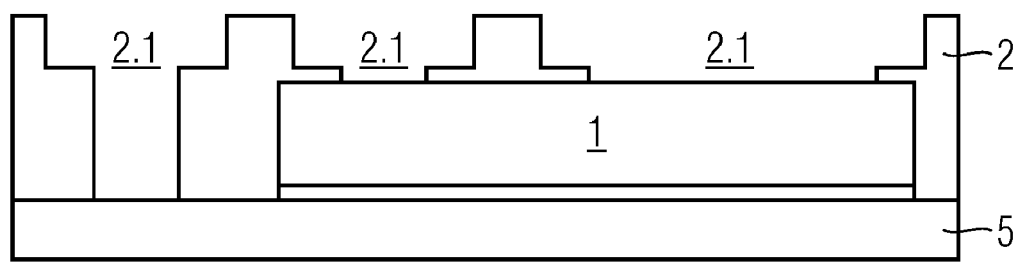

FIG. 5C illustrates a cross-sectional representation of a further intermediate product obtained after forming openings into the mask layer 20. The result as obtained is a mask 2 including openings 2.1 being aligned with contact pads or contact elements on the first main face 1A where the metal carrier 5 is coupled with a contact element on the second main face 1B of the chip 1. In one embodiment, the openings 2.1 can have a circular or square-shaped cross-section. Moreover, the openings 2.1 can have different cross-sections as illustrated in FIG. 5C. In one embodiment, the openings 2.1 can have different cross-sections in the vertical direction with a rather large cross-section in a vertical range adjacent to an upper surface of the mask 2 and a rather small cross-section in a vertical range adjacent to a lower surface of the mask 2.

Figure 5D:
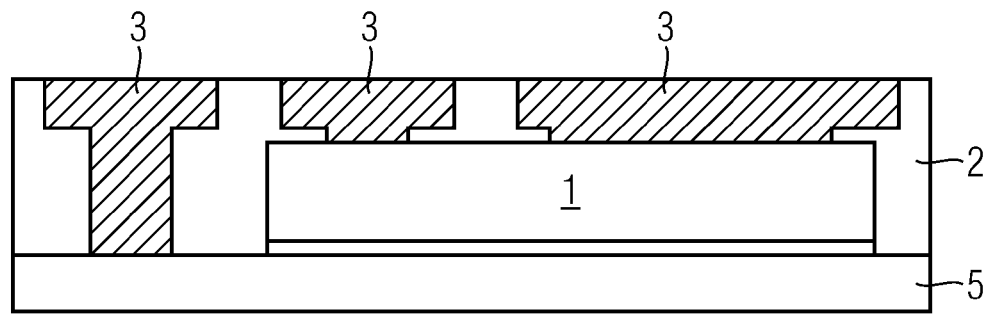

FIG. 5D illustrates a cross-sectional representation of a further intermediate product obtained after filling of the openings 2.1 of the mask 2 with a compound 3 which can be, for example in one embodiment, a silver nano paste containing silver nano particles. In one embodiment, the silver nano particles have an average diameter of around 5 nm. The compound 3 can be filled into the openings 2.1 by, for example, a screen printing process. Afterwards the intermediate product can be tempered and dried in order to reduce the amount of solvent in the compound 3.

Figure 5E:
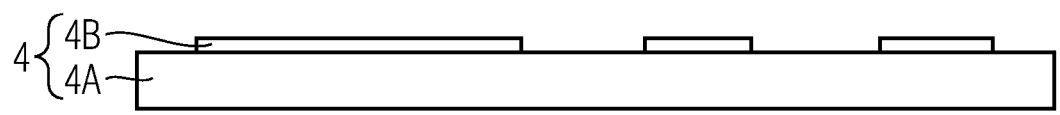

FIG. 5E illustrates a cross-sectional representation of an intermediate product in the form of a carrier 4 which is to be coupled to the intermediate product as illustrated in FIG. 5D. The carrier 4 includes a plastic layer 4A which in one embodiment can be made of an epoxy material, and a metallic layer 4B including contact elements. The carrier 4 can be fabricated by different methods like subtractive, semi-additive or full-additive processing techniques. The carrier 4, for example, can be fabricated by depositing a copper foil onto the plastic layer 4A and structuring the copper foil by using a mask and an etching process or by using laser structuring. The carrier 4 is pre-fabricated such that the contact elements of the metallic layer 4B are positioned so as to correspond with the surfaces of the compound 3 of the intermediate product of FIG. 5D.

Figure 5F:
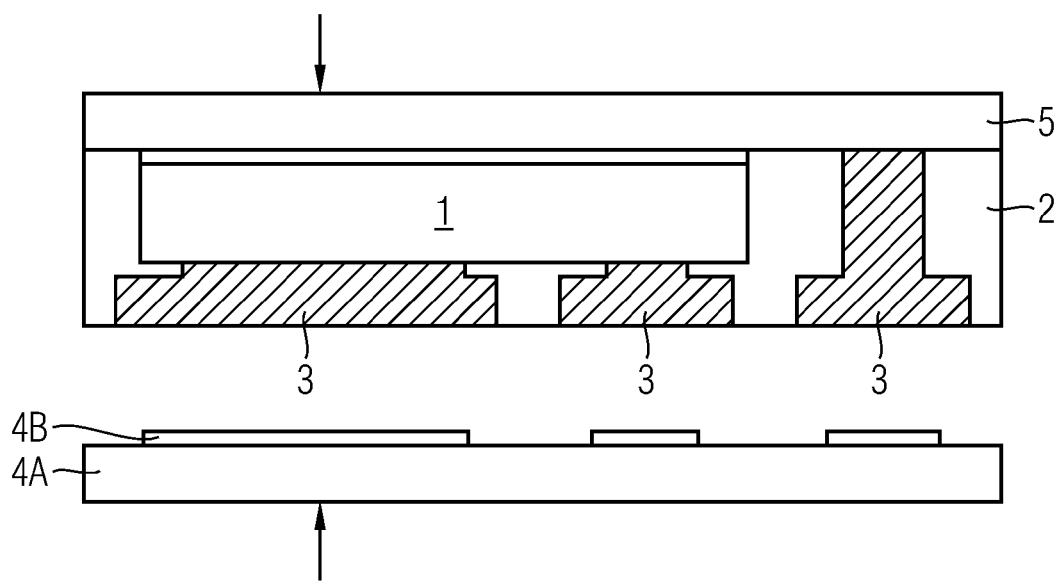
Figure 5G:
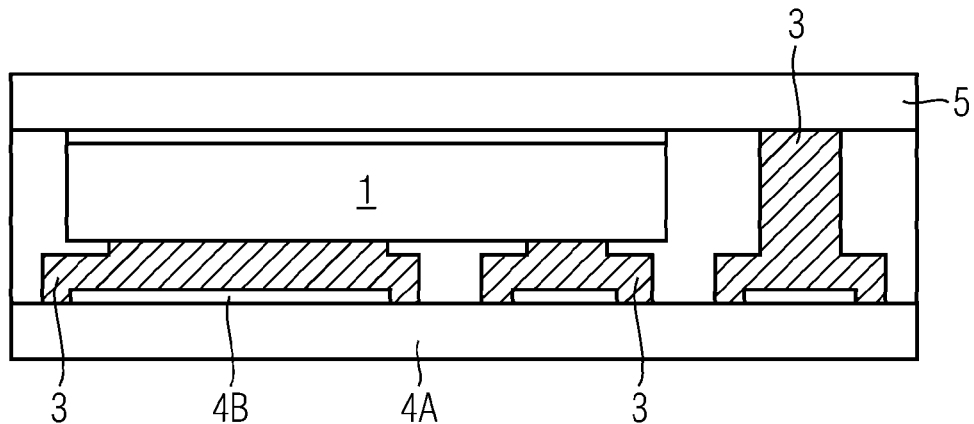

FIG. 5F illustrates cross-sectional representations of both intermediate products opposed to each other for carrying out the next process in which the two intermediate products are coupled to each other, illustrated in FIG. 5G. For this purpose the two intermediate products are pressed together and tempered wherein according to one embodiment pressure and heat are applied at one and the same time on the two intermediate products. Heating the pressed together intermediate products means sintering of the compound 3 wherein the compound 3, which is made of the silver nano paste, can be sintered at temperatures above 100° C. or above 150° C. and pressures in a range between 1 Mpa and 40 Mpa, in one embodiment between 2 MPa and 20 MPa.

Figure 6:
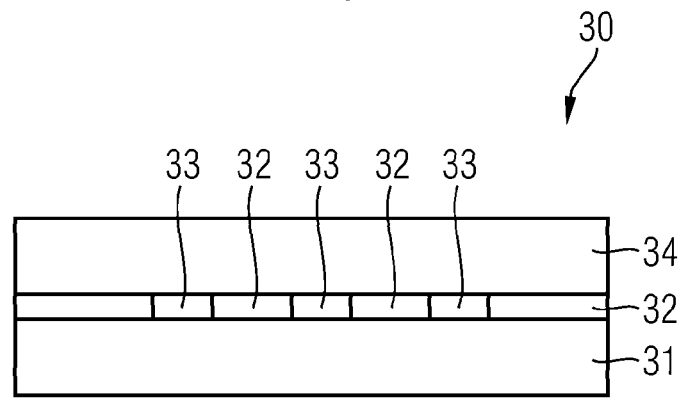
FIG. 6 illustrates a schematic cross-sectional representation of one embodiment of a semiconductor device.

According to one embodiment, the compound 3 includes nano particles made of an element metal like Ag, Sn or Cu, or of an alloy metal. According to another embodiment, as an alternative to a nano paste also a soldering paste can be applied as compound 3. Further as an alternative to thermal sintering as described before, also an electrical sintering process can be applied. In an electrical sintering process an electrical current is conducted through the contact pads of the semiconductor chip, the metal carrier 5, the compound 3 and the conductive elements of the metallic layer 4B. As a result only those portions of the compound 3 are heated with have to conduct electrical current in a later operation of the electrical system. Further portions of the compound 3 and of the other parts of the electrical system are not exposed to high temperatures. The thermal or electrical sintering process can also be carried out under an atmosphere of a forming gas or inert gas like $N_2$ Referring to FIG. 6, there is illustrated a cross-sectional representation of a semiconductor device according to one embodiment. The semiconductor device 30 includes a semiconductor chip 31 covered with a mask 32, a carrier 34, and disconnected regions 33 of sintered material between the semiconductor chip 31 and the carrier 34 for attaching the semiconductor chip 31 to the carrier 34.

According to one embodiment, the mask 32 is made of at least one of a polymer, a foil material, and a photo-structurable material.

According to one embodiment, the carrier 34 is at least one of a printed circuit board, a ceramic substrate, and a laminate substrate.

According to one embodiment, the carrier 34 includes conductive elements covered by the sintered material, in one embodiment covered by the disconnected regions 33 of the sintered material.

According to one embodiment, the sintered material is electrically conductive.

According to one embodiment, the carrier 34 is coupled to a first main face of the semiconductor chip 31, and a metal carrier is coupled to a second main face of the semiconductor chip 31.

According to one embodiment, the semiconductor chip 31 includes at least one contact element on a first main face and at least one contact element on a second main face.

According to one embodiment, the semiconductor chip 31 includes a MOSFET transistor, in one embodiment such that at least one electrode terminal is coupled with a contact element on a first main face of the semiconductor chip 31 and at least one other electrode terminal is coupled with a contact element on a second main face of the semiconductor chip 31.

According to one embodiment, the mask 32 is made of at least one of a polymer, a foil material, and a photo-structurable material.

Figure 7:
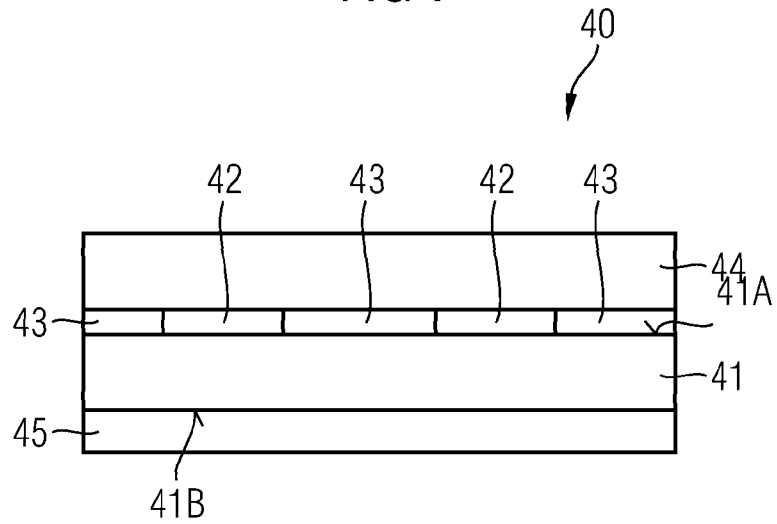
FIG. 7 illustrates a schematic cross-sectional representation of one embodiment of a semiconductor device.

Referring to FIG. 7, there is illustrated a cross-sectional representation of a semiconductor device according to one embodiment. The semiconductor device 40 includes a semiconductor chip 41 having a first main face 41A and a second main face 41B opposite to the first main face 41A, a metal carrier 45 coupled to the second main face 41B of the semiconductor chip 41, a carrier 44, and a sintered material 43 between the first main face 41A of the semiconductor chip 41 and the carrier 44 for attaching the semiconductor chip 41 to the carrier 44.

According to one embodiment, the carrier 44 is at least one of a printed circuit board, a ceramic substrate, and a laminate substrate.

According to one embodiment, the carrier 44 includes conductive elements covered by the sintered material 43.

According to one embodiment, the sintered material 43 is electrically conductive.

According to one embodiment, the semiconductor device 40 further includes a mask 42 covering the first main face 41A of the semiconductor chip 41. According to a further embodiment, the mask 42 is made of at least one of a polymer, a foil material, and a photo-structurable material.

According to one embodiment, the semiconductor chip 41 includes a MOSFET transistor, in one embodiment such that at least one electrode terminal is coupled with a contact element on a first main face of the semiconductor chip 41 and at least one other electrode terminal is coupled with a contact element on a second main face of the semiconductor chip 41.

Figure 8:
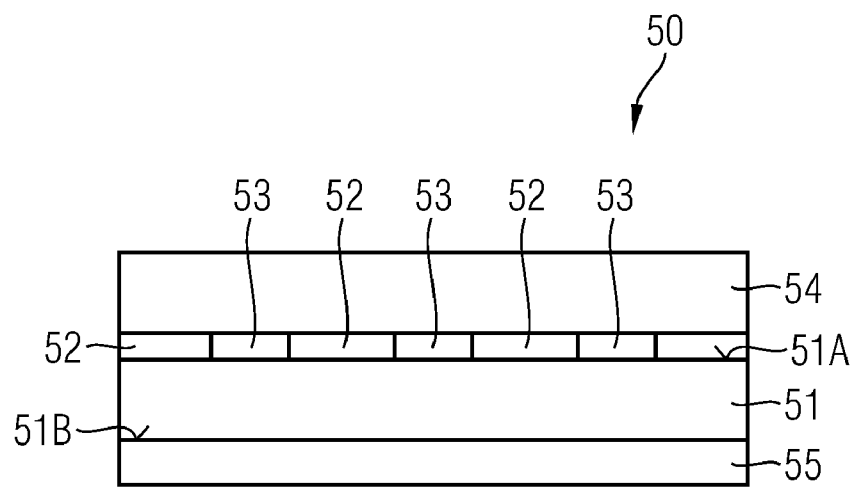
FIG. 8 illustrates a schematic cross-sectional representation of one embodiment of a semiconductor device.

Referring to FIG. 8, there is illustrated a cross-sectional representation of a semiconductor device according to one embodiment. The semiconductor device 50 includes a semiconductor chip 51 having a first main face 51A and a second main face 51B opposite to the first main face 51A, a mask 52 coupled to the first main face 51A of the semiconductor chip 51, a metal carrier 55 coupled to the second main face 51B of the semiconductor chip 51, a carrier 54, and disconnected regions 53 of sintered material between the first main face 51A of the semiconductor chip 51 and the carrier 54 in openings of the mask 52.

According to one embodiment, the carrier 54 is at least one of a printed circuit board, a ceramic substrate and a laminate substrate.

According to one embodiment, the carrier 54 includes conductive elements covered by the disconnected region 53 of the sintered material.

According to one embodiment, the sintered material is electrically conductive.

According to one embodiment, the mask 52 is made of at least one of a polymer, a foil material, and a photo-structurable material.

According to one embodiment, the semiconductor chip 51 includes a MOSFET transistor, in one embodiment such that at least one electrode terminal is coupled with a contact element on a first main face of the semiconductor chip 51 and at least one other electrode terminal is coupled with a contact element on a second main face of the semiconductor chip 51.

Figure 9:
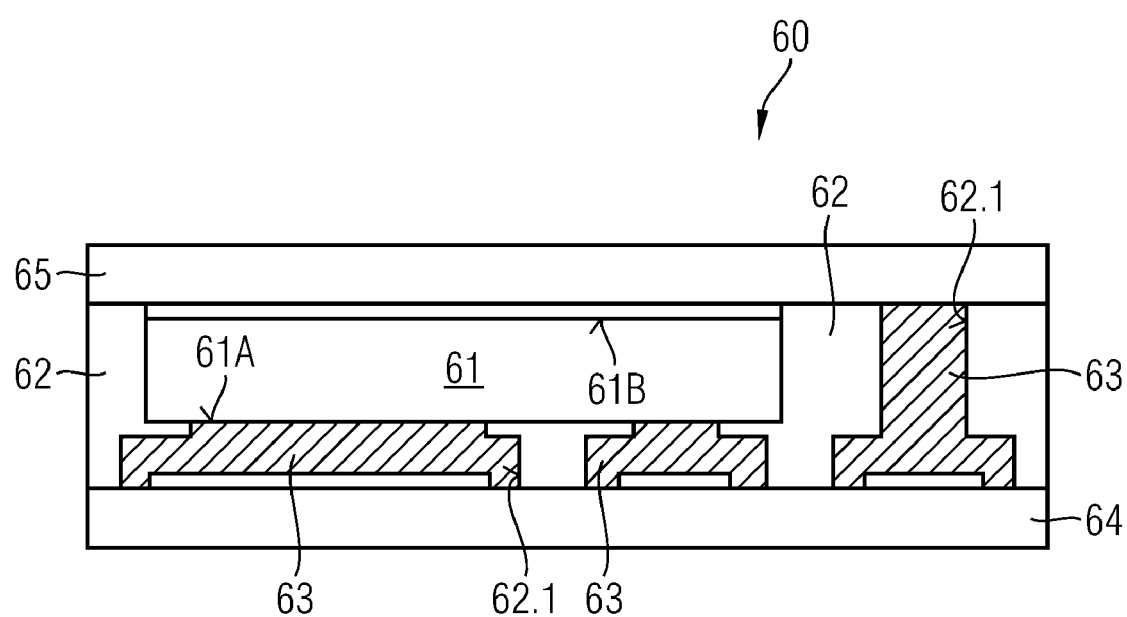
FIG. 9 illustrates a schematic cross-sectional representation of one embodiment of a semiconductor device.

Referring to FIG. 9, there is illustrated a cross-sectional representation of a semiconductor device according to one embodiment. The semiconductor device 60 as illustrated in FIG. 9 corresponds to the semiconductor device as depicted in FIG. 5G so that not all the details of the fabrication process will be repeated here. The semiconductor device 60 includes a semiconductor chip 61 having a first main face 61A and a second main face 61B opposite to the first main face 61A, a mask 62 covering the first main face 61A of the semiconductor chip 61, a metal carrier 65 coupled to the second main face 61B of the semiconductor chip 61, a carrier 64, and disconnected regions 63 of a sintered material between the first main face 61A of the semiconductor chip 61 and the carrier 64 in openings 62.1 of the mask 62.

According to one embodiment, the carrier 64 is at least one of a printed circuit board, a ceramic substrate, and a laminate substrate.

According to one embodiment, the carrier 64 includes conductive elements covered by the disconnected regions 63 of the sintered material.

According to one embodiment, the sintered material is electrically conductive.

According to one embodiment, the mask 62 is made of at least one of a polymer, a foil material, and a photo-structurable material.

According to one embodiment, the semiconductor chip 61 includes a MOSFET transistor, in one embodiment such that at least one electrode terminal is coupled with a contact element on a first main face of the semiconductor chip 61 and at least one other electrode terminal is coupled with a contact element on a second main face of the semiconductor chip 61.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an electronic system, comprising:
  providing a semiconductor chip having a first main face and a second main face opposite to the first main face;
  applying a mask to the first main face of the semiconductor chip;
  forming openings through the mask to the first main surface of the semiconductor chip which align with contact pads of the semiconductor chip;
  applying a compound to the first main face of the semiconductor chip via the openings, the compound comprising electronically conductive particles; and
  attaching the semiconductor chip to a carrier with the compound facing the carrier, the mask remaining in place and the carrier having conductive elements aligned with and having lateral dimensions less than lateral dimensions of the mask openings, wherein attaching the semiconductor chip includes pressing the semiconductor chip and carrier together so that exposed top and side surfaces of the conductive elements are embedded within the compound, and sintering the compound to electrically connect the contact pads of the semiconductor chip to the conductive elements of the carrier.

2. The method according to claim 1, comprising selectively applying the compound to the first main face of the chip.

3. The method according to claim 1, comprising wherein the carrier is at least one of a printed circuit board, a ceramic substrate, and a laminated substrate.

4. The method according to claim 1, comprising defining the mask to be made of at least of one of a polymer, a foil material, or a photo-structurable material.

5. The method according to claim 1, further comprising:
attaching a metal carrier to the second main face of the semiconductor chip.

6. The method of claim 1, wherein sintering comprises conducting an electrical current through the contact pads, the conductive elements, and the compound so that only the contact pads, conductive elements, and those portions of the compound in contact with the contact pads and conductive elements are exposed to high temperatures.

7. A method of manufacturing an electronic system, comprising:
providing a semiconductor chip having a first main face and a second main face opposite to the first main face;
attaching a metal carrier to the second main face of the semiconductor chip;
applying a mask over the first main surface of the semiconductor, the mask comprising openings extending through the mask to the first main surface of the semiconductor chip and which are aligned with contact pads of the semiconductor chip;
applying a compound to the first main face of the semiconductor chip via the openings in the mask, the compound comprising electronically conductive particles; and
attaching the semiconductor chip to a second carrier with the compound facing the second carrier, the mask remaining in place, the second carrier having conductive elements aligned with the mask openings, wherein attaching the semiconductor chip includes pressing the semiconductor chip and second carrier together so that exposed top and side surfaces of the conductive elements are embedded within the compound, and sintering the compound to electrically connect the contact pads of the semiconductor chip to the conductive elements of the second carrier.

8. The method according to claim 7, comprising selectively applying the compound to the first main face of the chip.

9. The method according to claim 7, comprising wherein the second carrier is at least one of a printed circuit board, a ceramic substrate, or a laminated substrate.

10. The method according to claim 7, comprising soldering the second main face of the chip to the metal carrier.

* * * * *